(12) United States Patent
Ikeda

(10) Patent No.: US 6,320,756 B1
(45) Date of Patent: Nov. 20, 2001

(54) ELECTRONIC DEVICE MOUNTING STRUCTURE USING ELECTRONIC DEVICE MOUNTING MEMBER AND CUSHIONING

(75) Inventor: Tomoki Ikeda, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/474,703

(22) Filed: Dec. 29, 1999

(30) Foreign Application Priority Data

Jan. 18, 1999 (JP) ................................................. 11-009637

(51) Int. Cl.[7] ......................................................... H05K 7/02
(52) U.S. Cl. ............................................. 361/760; 439/382
(58) Field of Search .................................. 361/760, 761; 439/382, 384, 694

(56) References Cited

U.S. PATENT DOCUMENTS

| | | | | |
|---|---|---|---|---|
| Re. 31,114 | * | 12/1982 | Berg ................................. | 439/17 CF |
| 4,150,420 | * | 4/1979 | Berg ................................. | 361/401 |
| 5,065,279 | * | 11/1991 | Lazenby et al. ................... | 361/386 |
| 5,527,187 | * | 6/1996 | Jurasek et al. ..................... | 439/24.7 |
| 5,729,433 | * | 3/1998 | Mok .................................. | 361/704 |
| 5,835,358 | * | 11/1998 | Brakus .............................. | 361/791 |
| 5,857,858 | * | 1/1999 | Gorowitz et al. .................. | 439/86 |
| 6,043,981 | * | 3/2000 | Markow et al. .................... | 361/704 |
| 6,054,676 | * | 4/2000 | Wall et al. ......................... | 219/209 |
| 6,058,000 | * | 5/2000 | Koenck et al. .................... | 361/113 |
| 6,093,996 | * | 7/2000 | Daidai ............................... | 310/340 |
| 6,115,259 | * | 9/2000 | Karner .............................. | 361/759 |

FOREIGN PATENT DOCUMENTS

| | | |
|---|---|---|
| 5-315467 | 11/1993 | (JP) . |
| 5-327272 | 12/1993 | (JP) . |
| 7-86714 | 3/1995 | (JP) . |

* cited by examiner

Primary Examiner—Tulsidas Patel
(74) Attorney, Agent, or Firm—Brinks Hofer Gilson & Lione

(57) ABSTRACT

An electronic device mounting structure comprising a motherboard having a cutout section, a plate-like mounting member, and a electronic device mounted on the mounting member. The mounting member is arranged in the cutout section, and with a cushioning member installed between the motherboard and the mounting member, the mounting member is attached to the motherboard.

5 Claims, 2 Drawing Sheets

ELECTRONIC DEVICE MOUNTING STRUCTURE USING ELECTRONIC DEVICE MOUNTING MEMBER AND CUSHIONING

BACKGROUND OF THE INVENTION

1. Field of the Invention

This invention relates to an electronic device mounting structure for mounting electronic device such as a TV tuner and others on a motherboard.

2. Description of Related Art

FIG. 4 shows a conventional electronic device mounting structure, in which a electronic device 31, such as a TV tuner and others having an unillustrated electronic circuit in a metal casing 31a, have a plurality of terminals 31b and a connector 31c mounted on the side face, and mounting legs 31d protruding on the underside of the metal casing 31a. The electronic device 31 are mounted on a motherboard 32 fixedly attached within an unillustrated TV receiver. The motherboard 32 is provided with unillustrated holes in which the terminals 31b and the mounting legs 31d of the electronic device 31 are inserted, and also conductors for wiring not depicted are formed.

The electronic device 31 mounted on the motherboard 32 is fixedly attached on the motherboard 32 by means of the mounting legs 31d inserted in the holes, and also the terminal 31c inserted in a hole is connected to the conductor for wiring on the motherboard 32.

The motherboard 32 mounted with the electronic device 31 is secured in a casing 33 of a TV receiver and others as shown in FIG. 5.

In a conventional mounting structure of the electronic device 31, the electronic device 31 is fixed on the motherboard 32. Furthermore, the motherboard 32 is fixed on the casing 33; and therefore, for example, if the casing 33 is used on a motor vehicle, the electronic device 31 is subjected to shock and vibration with the movement of the motor vehicle.

Therefore, the electronic components in the electronic device 31 are also subjected to vibration, whereby a spacing between the electronic components will be varied, resulting in a changed electric characteristic. Furthermore, in case the electronic device 31 is exposed to severe shocks, the mounting strength of the mounting legs 31d and the motherboard 32 will decrease, resulting in the occurrence of a relative displacement between the electronic device 31 and the motherboard 32 and accordingly in defective connection of wiring conductors between the terminal 31c and the motherboard 32.

SUMMARY OF THE INVENTION

It is, therefore, an object of this invention to provide an electronic device mounting structure capable of absorbing external shocks and vibrations, to thereby prevent direct application of shocks and vibrations to the electronic device.

As a means to solve the above-described problem, the electronic device mounting structure of this invention is provided with a motherboard having a cutout section, a plate-like mounting member, and electronic device mounted on the mounting member; and the mounting member is arranged in the cutout section, a cushioning member is inserted between the motherboard and the mounting member, and then the mounting member is attached on the motherboard.

The mounting member of the electronic device mounting structure of this invention is formed of a printed circuit board.

In the electronic device mounting structure of this invention, the cutout section serves as a hole, in which the mounting member is arranged.

Furthermore, in the electronic device mounting structure of this invention, there are formed mutually facing recesses, one in the inner peripheral edge of the cutout section and the other in the outer peripheral edge of the mounting member. The cushioning member is made in the shape of an hourglass having large-diameter portions on both ends of a small-diameter portion. This cushioning member is used with the small-diameter portion fitted in between the mutually facing recesses.

The foregoing objects and other objects of this invention will become more apparent and understandable from the following detailed description thereof, when read in connection with the accompanying drawings.

DESCRIPTION OF THE PREFERRED EMBODIMENTS

Figure 1:
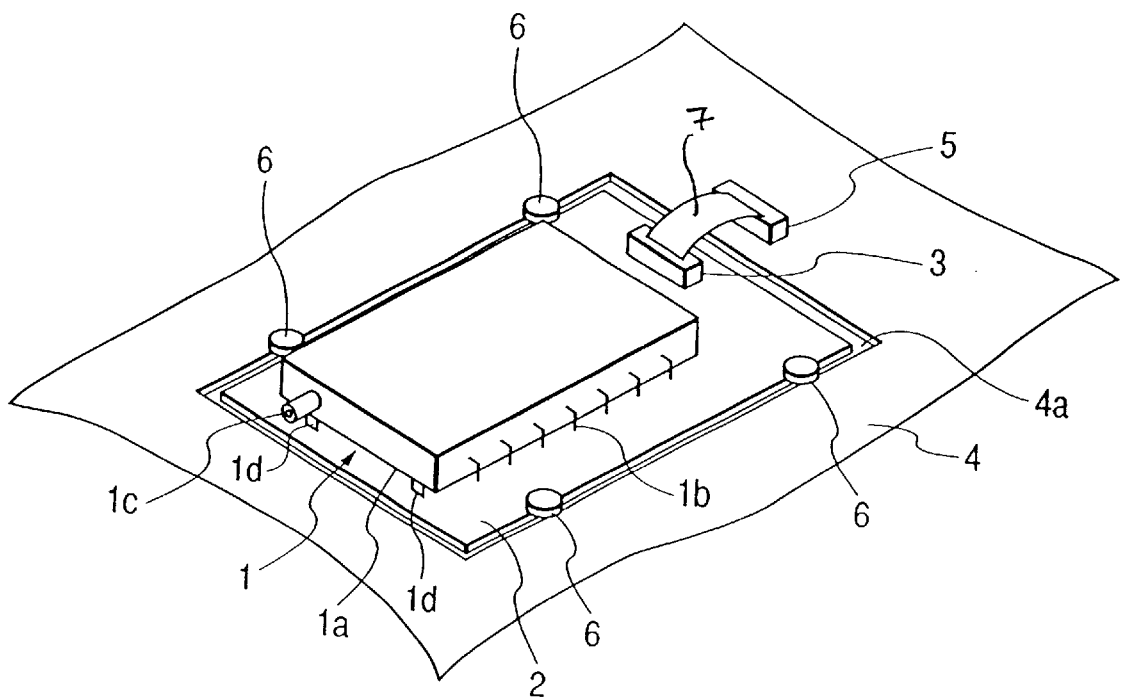
FIG. 1 is a perspective view of an electronic device mounting structure according to this invention.

FIG. 1 shows an electronic device mounting structure of this invention. For mounting a electronic device 1 such as a TV tuner, an electronic circuit not shown is provided inside of the metal casing 1a, on the side surface of which a plurality of terminals 1b and a connector 1c are attached; on the metal casing 1a, mounting legs 1d protruding to the lower side are provided. The electronic device 1 is mounted on a plate-like mounting member 2 comprising a printed circuit board.

Figure 2:
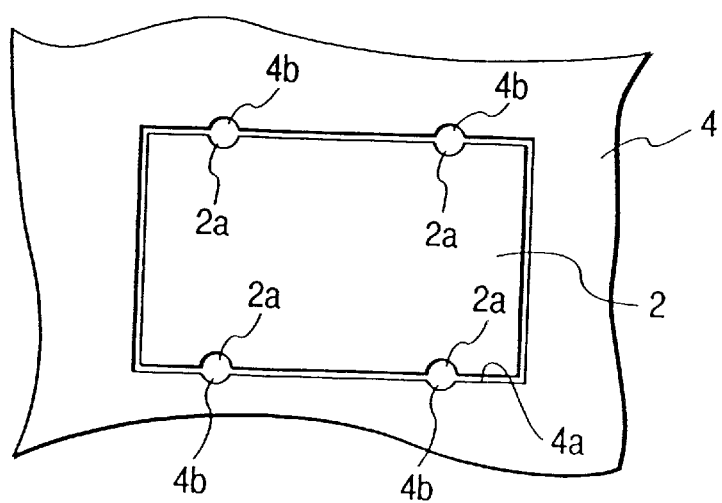
FIG. 2 is a plan view of a motherboard and a mounting plate in the electronic device mounting structure of this invention.

The mounting member 2 has a slightly larger shape than the external shape of the electronic device 1, and is provided with unillustrated holes for inserting the terminals 1b and mounting legs 1d of the electronic device 1, and also with an unillustrated wiring conductor on the upper or lower side. Furthermore, in the outer peripheral edge, there is provided a first semicircular recess 2a formed by cutting as shown in FIG. 2. Furthermore, on the upper side of the mounting member 2, a first connector 3 is attached in connection with the wiring conductor.

The electronic device 1 mounted on the mounting member 2 is secured to the mounting member 2 by means of the mounting legs 1d inserted in the holes, and the terminals 1b inserted in the holes are connected to the wiring conductor located on the mounting member 2.

The terminal 1b, therefore, is connected to the first connector 3 through the wiring conductor on the mounting member 2.

The motherboard 4 with the mounting member 2 mounted has a cutout section 4a which is a hole formed larger than the external shape of the mounting member 2. Inside of this cutout section 4a, the mounting member 2 is arranged. In the inner peripheral edge of the motherboard 4, a second semicircular recess 4b is formed oppositely to the first recess 2a of the mounting member 2 as shown in FIG. 2.

On the upper or lower side of the motherboard 4, a wiring conductor not depicted is installed. The wiring conductor is connected with the second connector 5 attached on the upper side.

Figure 3:
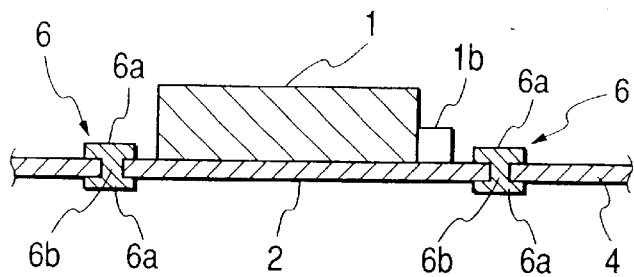
FIG. 3 is a sectional view of a major portion in the electronic device mounting structure of this invention.
Figure 4:
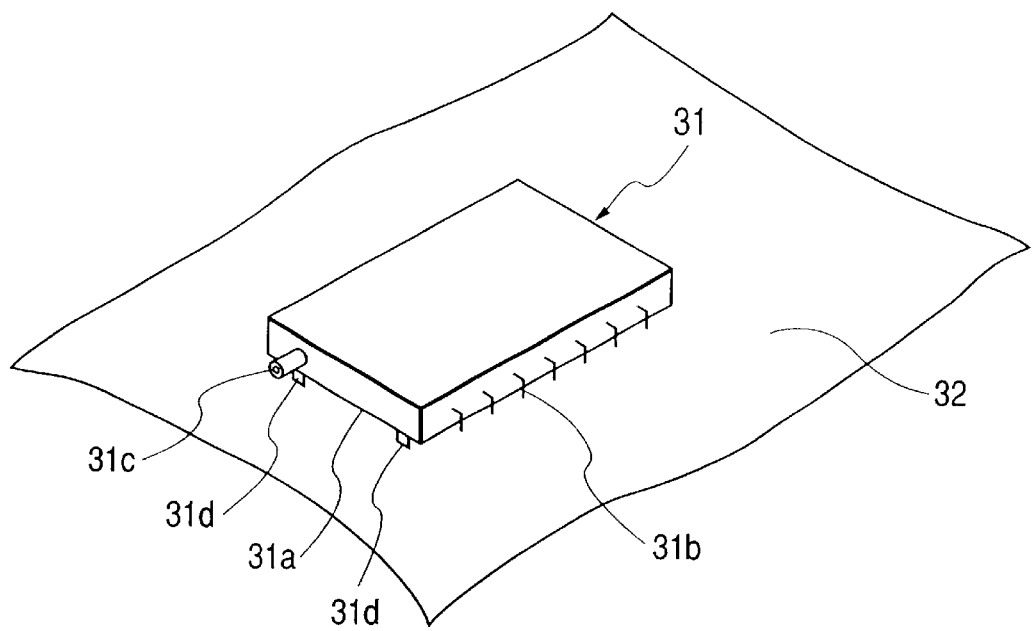
FIG. 4 is a perspective view of a conventional electronic device mounting structure.
Figure 5:
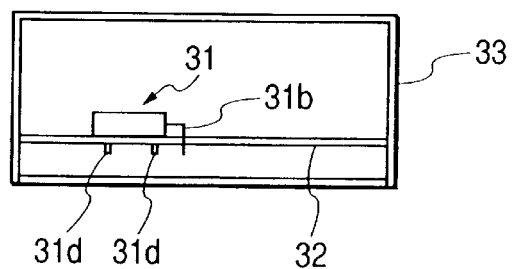
FIG. 5 is a sectional view of a major portion of a TV receiver using the conventional electronic device mounting structure.

In the state that the mounting member 2 is arranged within the cutout section 4a of the motherboard 4, the first recess 2a of the mounting member 2 is positioned oppositely to the second recess 4b of the motherboard 4. The mounting member 2 is attached to the motherboard 4 by means of a cushioning member 6 inserted between the first recess 2a and the second recess 4b. The cushioning member 6 is made of rubber for example, in a form of an hourglass having large-diameter portions 6a, 6a on both ends and a small-diameter portion 6b at a midsection as shown in FIG. 3. The large-diameter portion 6a is larger in diameter than the spacing between the first recess 2a and the second recess 4b which face each other; and the small-diameter portion 6b is elastically retained between the first recess 2a and the second recess 4b to thereby attach the mounting member 2 to the motherboard 4.

As a result, the large-diameter portion 6a of the cushioning member 6 can not slip out from between the first recess 2a and the second recess 4b.

The electronic device 1 and the motherboard 4 are electrically connected by a flat cable 7 or other connecting between the first connector 3 and the second connector 5.

The motherboard 4 mounted with the electronic device 1 is attached in a casing for a TV receiver and others.

The electronic device mounting structure of this invention, as described above, is provided with a motherboard having a cutout section, a plate-like mounting member, and an electronic device mounted on the mounting member; and the mounting member is arranged in the cutout section, a cushioning member is inserted between the motherboard and the mounting member, and then the mounting member is attached on the motherboard. It is, therefore, possible to absorb external shocks and vibrations, to thereby prevent direct application of shocks and vibrations to the electronic device.

Furthermore, in the electronic device mounting structure of this invention, since the mounting member is formed of a printed circuit board, a wiring conductor is fitted on the printed circuit board to thereby electrically connect the electronic device to the motherboard.

Furthermore, in the electronic device mounting structure of this invention, a cutout section is provided as a hole in which a mounting member is arranged to thereby be securely held at the outer periphery to the motherboard.

Furthermore, in the electronic device mounting structure of this invention, recesses are formed mutually oppositely in the inner peripheral edge of the cutout section and the outer peripheral edge of the mounting member; and the cushioning member of an hourglass shape is provided with a large-diameter portion on either end of the small-diameter portion, which is fitted in between the opposite recesses. Therefore, the cushioning member will never slip out from the mounting member and the motherboard.

What is claimed is:

1. An electronic device mounting structure, comprising:
   a motherboard having a cutout section;
   a mounting member shaped like a flat plate; and
   an electronic device mounted on said mounting member, said mounting member being arranged in said cutout section, said mounting member being joined to said motherboard with a cushioning member, said cushioning member having an hourglass shape with a large diameter portion at either end of a small diameter portion, and said mounting member being mounted on said motherboard by retaining said small diameter portion between a cross section of said cutout section of said motherboard and a cross section of said mounting member.

2. An electronic device mounting structure according to claim 1, wherein said mounting member is formed of a printed circuit board.

3. An electronic device mounting structure according to claim 1, wherein said cutout section is a hole, in which said mounting member is arranged.

4. An electronic device mounting structure according to claim 3, wherein mutually opposite recesses are formed in an inner peripheral edge of said cutout section and in an outer peripheral edge of said mounting member; and said small diameter portion is retained in between said opposite recesses.

5. An electronic device mounting structure according to claim 3, wherein said cushioning member is made of rubber.

* * * * *